(12) United States Patent
Lee et al.

(10) Patent No.: US 8,567,695 B2
(45) Date of Patent: Oct. 29, 2013

(54) PIEZOELECTRIC DEVICE, INKJET PRINT HEAD AND METHOD OF MANUFACTURING THE SAME

(75) Inventors: Tae Kyung Lee, Gyunggi-do (KR); Kyo Yeol Lee, Gyunggi-do (KR); Seung Mo Lim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/357,164

(22) Filed: Jan. 24, 2012

(65) Prior Publication Data

US 2013/0050350 A1  Feb. 28, 2013

(30) Foreign Application Priority Data

Aug. 29, 2011  (KR) .................. 10-2011-0086522

(51) Int. Cl.
| | |
|---|---|
| B05B 1/08 | (2006.01) |
| H01L 41/22 | (2013.01) |
| H01L 41/18 | (2006.01) |
| H01L 41/187 | (2006.01) |
| B41J 2/045 | (2006.01) |
| C04B 35/495 | (2006.01) |
| C04B 35/00 | (2006.01) |

(52) U.S. Cl.
USPC ..... 239/102.2; 29/25.35; 347/68; 252/62.9 R; 252/62.9 PZ (58) Field of Classification Search
USPC ......................... 347/68; 252/62.9 R, 62.9 PZ
See application file for complete search history.

(56) References Cited

U.S. PATENT DOCUMENTS

| | | | | |
|---|---|---|---|---|
| 5,639,508 | A * | 6/1997 | Okawa et al. ................. | 427/100 |
| 5,792,379 | A * | 8/1998 | Dai et al. ............... | 252/62.9 PZ |
| 2004/0072670 | A1* | 4/2004 | Kasukawa et al. ........... | 501/134 |
| 2011/0121096 | A1 | 5/2011 | Nihei et al. | |

FOREIGN PATENT DOCUMENTS

| | | |
|---|---|---|
| JP | 8-148731 | 6/1996 |
| JP | 2001-206769 | 7/2001 |
| JP | 2005-85937 | 3/2005 |
| JP | 2006-322785 | 11/2006 |
| KR | 2000-0026332 | 5/2000 |
| KR | 2001-0005716 | 1/2001 |
| KR | 10-2006-0082913 | 7/2006 |
| KR | 10-2011-0050594 | 5/2011 |
| WO | WO 98/43925 | 10/1998 |

OTHER PUBLICATIONS

Korean Office Action Issued Mar. 19, 2013 in corresponding Korean Patent Application No. 10-2011-0086522.
Japanese Office Action issued Jul. 23, 2013 in corresponding Japanese Application No. 2012-019029.

\* cited by examiner

*Primary Examiner* — Lisa M Solomon (57) ABSTRACT

There are provided a piezoelectric device, an inkjet print head, and a method of manufacturing the same. The piezoelectric device includes piezoelectric ceramic powder containing 90 parts by weight or more to less than 100 parts by weight of $Pb(Zr, Ti)O_3$, and more than 0 part by weight to 10 parts by weight or less of glass frit, based on 100 parts by weight of a piezoelectric substance composition for the piezoelectric device, wherein the glass frit contains 10 to 20 parts by weight of ZnO, based on 100 parts by weight of glass frit.

13 Claims, 8 Drawing Sheets

PIEZOELECTRIC DEVICE, INKJET PRINT HEAD AND METHOD OF MANUFACTURING THE SAME

CROSS-REFERENCE TO RELATED APPLICATIONS

This application claims the priority of Korean Patent Application No. 10-2011-0086522 filed on Aug. 29, 2011, in the Korean Intellectual Property Office, the disclosure of which is incorporated herein by reference.

BACKGROUND OF THE INVENTION

1. Field of the Invention

The present invention relates to a piezoelectric device, an inkjet print head, and a method of manufacturing the same, and more particularly, to a piezoelectric device having improved piezoelectric characteristics while being environmentally friendly, an inkjet print head, and a method of manufacturing the same.

2. Description of the Related Art

An inkjet print head is generally an apparatus for printing an image of a predetermined color by discharging a small amount of droplet of ink for printing to a desired position on a recording paper. As ink discharging types for the inkjet printer, there are provided an electro-thermal transducer (a bubble jet type), generating bubbles in ink using a heat source and discharging the ink by this force as well as an electromechanical transducer (a piezoelectric type), discharging ink by a change in ink volume generated due to deformation of a piezoelectric substance using the piezoelectric substance.

The piezoelectric type inkjet print head is manufactured by cutting machining a plurality of thin plates mainly made of a ceramic material, a metal material, a synthetic resin material, or the like, to form an ink channel, and stacking the plurality of thin plates. A piezoelectric device is mounted on the inkjet print head so as to apply pressure to the ink channel. Voltage is applied to the piezoelectric device to apply pressure to the ink channel, such that the ink may be discharged.

The piezoelectric device has a structure in which a piezoelectric substance is disposed between two electrodes charged with different polarities, the piezoelectric substance being formed by printing a piezoelectric substance paste containing a piezoelectric substance composition. In addition, the piezoelectric device may be manufactured by sintering the piezoelectric substance paste.

In the case of a general piezoelectric substance composition, a firing temperature of 1000° C. or more is required. When a firing temperature is high, materials constituting the electrodes may be volatilized or materials constituting a substrate may be deformed, such that material properties are deteriorated. In addition, cadmium (Cd) is generally used in order to lower a firing temperature, which is a barrier to meeting environmental protection regulations. Therefore, research into various materials capable of implementing excellent piezoelectric characteristics while substituting for Cd has been conducted.

SUMMARY OF THE INVENTION

An aspect of the present invention provides a piezoelectric substance capable of being sintered at a low temperature, without using cadmium (Cd) to solve defects arising due to high temperature sintering.

Another aspect of the present invention provides a piezoelectric device capable of having excellent piezoelectric characteristics, securing repeatability according to applied voltage, and easily implementing micro-displacement movement.

According to an aspect of the present invention, there is provided a piezoelectric device comprising: piezoelectric ceramic powder containing 90 parts by weight or more to less than 100 parts by weight of $Pb(Zr, Ti)O_3$, and more than 0 part by weight to 10 parts by weight or less of glass frit, based on 100 parts by weight of a piezoelectric substance composition for the piezoelectric device, wherein the glass frit contains 10 to 20 parts by weight of ZnO, based on 100 parts by weight of glass frit.

The piezoelectric ceramic powder may have a composition of $xPb(Mg_{1/3}Nb_{2/3})\text{-}y(Ni_{1/3}Nb_{2/3})\text{-}zZr\text{-}wTi\text{—}O_3$, where each of x, y, z, and w is mol % and satisfies $0.15 \le x \le 0.40$, $0.05 \le y \le 0.20$, $0.20 \le z \le 0.35$ and $0.30 \le w \le 0.45$.

The glass frit may contain 65 to 85 parts by weight of $Bi_2O_3$ and 5 to 15 parts by weight of $B_2O_3$ based on 100 parts by weight of glass frit.

The piezoelectric device may be formed by printing a piezoelectric substance paste for preparing a piezoelectric substance, the piezoelectric substance paste containing 80 to 85 parts by weight of the piezoelectric substance composition, 10 to 14 parts by weight of a solvent, and 1 to 10 parts by weight of an additive, based on 100 parts by weight of the piezoelectric substance paste.

A sintering temperature of the piezoelectric substance paste may be 900 to 1000° C.

According to another aspect of the present invention, there is provided an inkjet print head including: a substrate including a pressure chamber formed therein; a first electrode formed on the pressure chamber of the substrate; a piezoelectric substance containing the piezoelectric substance composition for the piezoelectric device of any one of claims 1 to 5; and a second electrode formed on the piezoelectric substance.

According to another aspect of the present invention, there is provided a method of manufacturing a piezoelectric device, the method including: forming a first electrode; forming a piezoelectric substance on the first electrode by printing a piezoelectric substance paste containing a piezoelectric substance composition thereon, the piezoelectric substance composition containing piezoelectric ceramic powder containing 90 parts by weight or more to less than 100 parts by weight of $Pb(Zr, Ti)O_3$ and more than 0 part by weight to 10 parts by weight or less of glass frit, based on 100 parts by weight of the piezoelectric substance composition, the glass frit containing 10 to 20 parts by weight of ZnO, based on 100 parts by weight of glass frit; forming a second electrode on the piezoelectric substance; and sintering a substrate, the first electrode, the piezoelectric substance, and the second electrode.

The piezoelectric substance paste may contain 80 to 85 parts by weight of the piezoelectric substance composition, 10 to 14 parts by weight of a solvent, and 1 to 10 parts by weight of an additive, based on 100 parts by weight of the piezoelectric substance paste.

A sintering temperature of the piezoelectric substance paste may be 900 to 1000° C.

The piezoelectric ceramic powder may have a composition of $xPb(Mg_{1/3}Nb_{2/3})\text{-}y(Ni_{1/3}Nb_{2/3})\text{-}zZr\text{-}wTi\text{—}O_3$, where each of x, y, z, and w is mol % and satisfies $0.15 \le x \le 0.40$, $0.05 \le y \le 0.20$, $0.20 \le z \le 0.35$, and $0.30 \le w \le 0.45$.

The glass frit may contain 65 to 85 parts by weight of $Bi_2O_3$ and 5 to 15 parts by weight of $B_2O_3$ based on 100 parts by weight of glass frit.

According to another aspect of the present invention, there is provided a method of manufacturing an inkjet print head, the method including: preparing a substrate made of single crystalline silicon and having an ink channel formed therein; and forming the piezoelectric device of any one of claims 7 to 11 on the substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Hereinafter, embodiments of the present invention will be described in detail with reference to the accompanying drawings.

In describing the present invention below, terms indicating components of the present invention are named in consideration of the function of each component. Therefore, the terms should not be understood as being limited technical components of the present invention.

Figure 1:
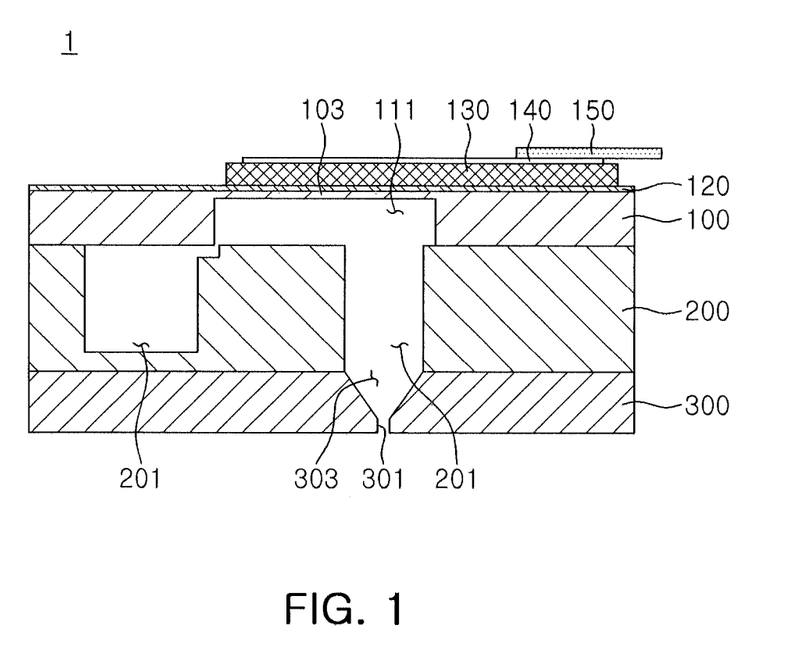
FIG. 1 is a schematic cross-sectional view of an inkjet print head according to an embodiment of the present invention.

FIG. 1 is a schematic cross-sectional view of an inkjet print head 1 according to an embodiment of the present invention.

Hereinafter, the present invention will be described in more detail.

The inkjet print head 1 according to the embodiment of the present invention includes an upper substrate 100, an intermediate substrate 200, and a lower substrate 300, having an ink channel formed therein, and a first electrode 120, a piezoelectric substance 130, and a second electrode 140, formed on the upper substrate 100. In addition, a printed circuit board 150 is connected to the second electrode 140 to control voltage applied to the piezoelectric substance 130, whereby the inkjet print head 1 capable of implementing a small amount of droplet may be provided.

The inkjet print head 1 according to the embodiment of the present invention may be formed by stacking a plurality of thin plates and bonding the thin plates to each other.

The inkjet print head 1 may be formed by sequentially stacking the upper substrate 100, the intermediate substrate 200, and the lower substrate 300 and bonding them to each other.

The upper substrate 100 includes a pressure chamber 111 capable of applying pressure to the ink channel according to a change in a piezoelectric device. A thin portion of the upper substrate 100, which is a vibration part 103, may transfer the change in a piezoelectric device to the pressure chamber 111.

The intermediate substrate 200 may include a reservoir 201 connected to the pressure chamber 111. The reservoir 201 stores ink introduced from an ink container (not shown) therein and fills ink to be discharged therein.

The lower substrate 300 is provided with a nozzle part including an ink inducing part 303 and an ink discharging part 301. The ink inducing part 303 is connected to the reservoir 201 to thereby serve to induce the ink to be discharged to the nozzle part when pressure is applied to the pressure chamber. In addition, the ink discharging part 301 may discharge the ink to the outside.

The upper substrate 100, the intermediate substrate 200, and the lower substrate 300 are stacked to thereby form the ink channel for discharging the ink. The piezoelectric device may be mounted on the upper substrate 100 and may have a shape deformed according to applied voltage to thereby apply pressure to the ink channel, thereby discharging the ink.

The piezoelectric device according to the embodiment of the present invention may include the first electrode 120, the piezoelectric substance 130, and the second electrode 140.

The piezoelectric device may be a device capable of implementing contraction and expansion in a piezoelectric material according to applied voltage. The piezoelectric device may repeatedly implement micro-sized movements by controlling a magnitude of voltage applied thereto. Although the embodiment of the present invention discloses a case in which the piezoelectric device is mounted on the inkjet print head 1 and is used to apply pressure to the ink channel, the present invention is not necessarily limited thereto. The piezoelectric device may be applied to various products for implementing repetitive micro-movements.

According to the embodiment of the present invention, as the piezoelectric substance of the piezoelectric device, lead zirconium titanite ceramics (PZTs) may be used. PZT, a material having a composition of $Pb(Zr, Ti)O_3$ and a complex perovskite structure, may have ferroelectric or antiferroelectric characteristics. PZT is a material having excellent efficiency in the conversion of electrical energy into mechanical energy, and may be used to implement repetitive micro-movements.

According to the embodiment of the present invention, the piezoelectric device may contain piezoelectric ceramic powder containing 90 parts by weight or more to less than 100 parts by weight of $Pb(Zr, Ti)O_3$, and more than 0 part by weight to 10 parts by weight or less of glass frit, based on 100 parts by weight of a piezoelectric substance composition. When a content of the glass frit exceeds 10 parts by weight, unique piezoelectric characteristics of the piezoelectric substrate may be deteriorated. In addition, the glass frit may contain 10 to 20 parts by weight of ZnO, based on 100 parts by weight of glass frit.

The piezoelectric substance composition constituting the piezoelectric substance according to the embodiment of the present invention may contain piezoelectric ceramic powder containing $Pb(Zr, Ti)O_3$, that is, lead zirconium titanite ceramics (PZTs). PZT powder may implement excellent piezoelectric characteristics.

According to the embodiment of the present invention, the piezoelectric ceramic powder has a composition of $xPb(Mg_{1/3}Nb_{2/3})$-$y(Ni_{1/3}Nb_{2/3})$-$zZr$-$wTi$—$O_3$, where each of x, y, z, and w is mol % and may satisfy $0.15 \leq x \leq 0.40$, $0.05 \leq y \leq 0.20$, $0.20 \leq z \leq 0.35$, and $0.30 \leq w \leq 0.45$.

In the case of using piezoelectric ceramic powder having the above-mentioned composition, the piezoelectric device having excellent piezoelectric characteristics may be implemented and repetitive micro-movements may be easily implemented.

According to the embodiment of the present invention, glass may be provided in the form of glass frit so as to help bonding between piezoelectric ceramic powder particles, lower a sintering temperature of the piezoelectric ceramic powder, and provide a piezoelectric substance having excellent densification.

The glass frit is prepared as follows. Raw materials are weighted according to respective compositions thereof and distilled water and Zirconia balls are injected thereinto, such that the raw materials, the distilled water, and the Zirconia balls are then uniformly mixed with each other for 12 hours. The slurry is dried, placed into an aluminum crucible, and then melted at a high temperature of 1000□ or more. Then, distilled water is poured into the aluminum crucible to rapidly cool the molten powder, thereby forming a glassy material. Then, the glassy material may be dissolved, such that powder having the form of glass frit may be provided. The piezoelectric substance composition according to the embodiment of the present invention may be prepared by mixing the glass frit and the piezoelectric ceramic powder as described above with each other.

According to the embodiment of the present invention, the glass frit may contain 10 to 20 parts by weight of ZnO, based on 100 parts by weight of glass frit.

ZnO may lower a sintering temperature of the piezoelectric ceramic powder while implementing excellent piezoelectric characteristics of the piezoelectric ceramic powder.

The glass frit may contain 10 to 20 parts by weight of ZnO, based on 100 parts by weight of glass frit. When a content of ZnO is less than 10 parts by weight, a sintering temperature may not be lowered to 900° C. or less, while when the glass frit exceeds 20 parts by weight, piezoelectric characteristics may be affected. Therefore, the glass frit may contain 10 to 20 parts by weight of ZnO, based on 100 parts by weight of glass frit in order to maintain a sintering temperature of 900 to 1000° C. and implement excellent piezoelectric characteristics.

According to the embodiment of the present invention, $Bi_2O_3$—$B_2O_3$—ZnO based glass frit may be used. The $Bi_2O_3$—$B_2O_3$—ZnO based glass frit may contain, but is not limited to, 65 to 85 parts by weight of $Bi_2O_3$ and 5 to 15 parts by weight of $B_2O_3$ based on 100 parts by weight of glass frit in order to satisfy a sintering temperature range of the piezoelectric substance composition according to the embodiment of the present invention. $Bi_2O_3$ has a melting temperature lower than those of $B_2O_3$ and ZnO, such that a ratio thereof contained in the glass frit may be high. However, when $Bi_2O_3$ is excessively contained in the glass frit, glass frit properties may be degraded. Therefore, the glass frit may contain 65 to 85 parts by weight of $Bi_2O_3$ and 5 to 15 parts by weight of $B_2O_3$.

The piezoelectric substance composition according to the embodiment of the present invention is formed to have a sintering temperature of 900 to 1000° C., such that even in the case that the first and second electrodes are formed while having the piezoelectric substance therebetween, and then sintered together, the volatilization of materials constituting the first and second electrodes may be prevented. In addition, a defect in which the materials constituting the electrodes react with adjacent materials such as a silicon substrate may be solved.

In addition, the piezoelectric substance composition may be used to prepare a piezoelectric substance capable of being sintered at a low temperature while maintaining excellent piezoelectric characteristics, without containing Cd. Therefore, the piezoelectric device capable of implementing excellent piezoelectric characteristics without discharging environmentally harmful Cd may be manufactured.

According to the embodiment of the present invention, a piezoelectric substance paste containing the piezoelectric substance composition, a solvent, and an additive are used in order to manufacture the piezoelectric substance.

The piezoelectric substance composition may be a composition containing the piezoelectric ceramic powder and the glass frit as described above, and the solvent may be used to disperse the piezoelectric ceramic powder and the glass frit in a paste state. As the additive, various additives serving to help viscosity and dispersibility of the piezoelectric substance paste, such as a binder or a dispersing agent may be used.

According to the embodiment of the present invention, as the solvent, terpineol or butyl carbitol acetate may be used. However, the solvent is not limited thereto. That is, various solvents may be used.

As the additive, a dispersing agent and a binder such as ethylcellulose may be used. However, the additive is not necessarily limited thereto. That is, various dispersing agents and binders may be used.

The piezoelectric substance paste may contain 80 to 85 parts by weight of the piezoelectric substance composition, 10 to 14 parts by weight of the solvent, and 1 to 10 parts by weight of the additive, based on 100 parts by weight of the piezoelectric substance paste.

The piezoelectric substance composition in which the piezoelectric ceramic powder and the glass frit are mixed with each other according to the embodiment of the present invention may implement piezoelectric characteristics in the piezoelectric device. As the piezoelectric substance composition, the glass frit containing Zn and the PZT powder described above may be used.

The piezoelectric substance paste may contain 80 to 85 parts by weight of the piezoelectric substance composition based on 100 parts by weight of the piezoelectric substance paste. When a content of the piezoelectric substance composition is less than 80 parts by weight, viscosity of the piezoelectric substance paste is reduced, such that it is difficult to secure a predetermined thickness of the piezoelectric substance during a printing process such as a screen printing process, or the like. That is, due to the reduced thickness of the piezoelectric substance, when voltage is applied to the piezoelectric substance during the printing process, the piezoelectric substance is broken down, whereby stable driving may not be performed. When a content of the piezoelectric substance composition exceeds 85 parts by weight, viscosity of the piezoelectric substance paste is increased, such that it is difficult to use the piezoelectric substance paste in a printing process such as a screen printing process, or the like.

The piezoelectric substance paste may contain 10 to 14 parts by weight of the solvent based on 100 parts by weight of the piezoelectric substance paste. When a content of the solvent is less than 10 parts by weight, dispersibility of the piezoelectric substance composition may be deteriorated, while the content of the solvent exceeds 14 parts by weight, impurities may be contained in a sintered body or density of the piezoelectric substance composition may be deteriorated, such that piezoelectric characteristics may be deteriorated.

FIGS. 2A through 2D are flow charts showing a process of manufacturing an inkjet print head according to an embodiment of the present invention.

Figure 2A:
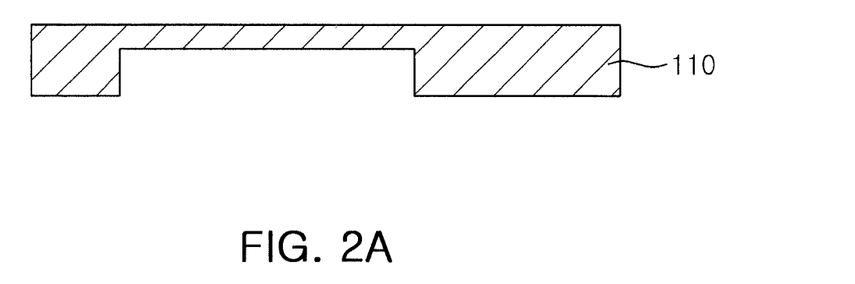
FIGS. 2A through 2D are flow charts showing a process of manufacturing an inkjet print head according to an embodiment of the present invention.
Figure 2B:
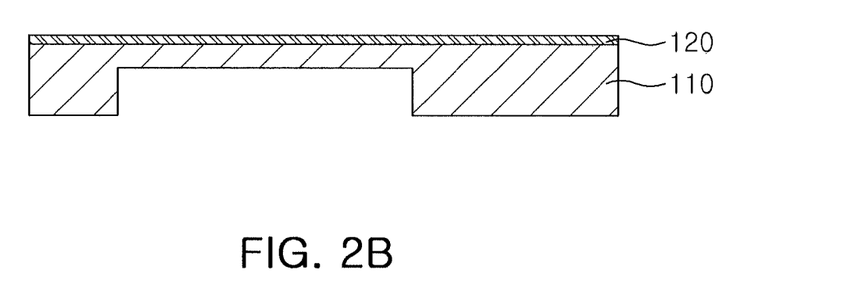
Figure 2C:
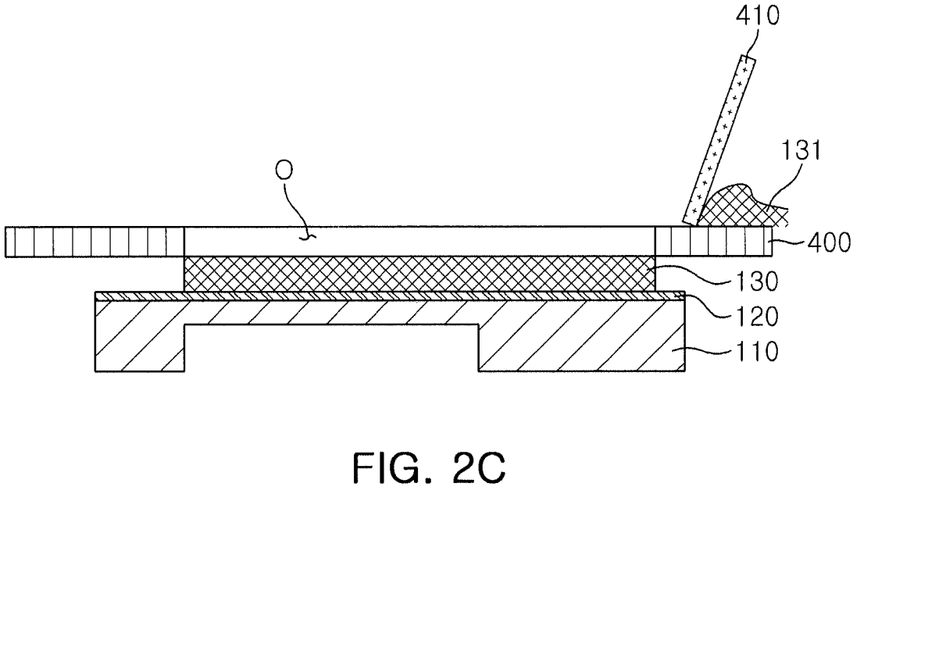
Figure 2D:
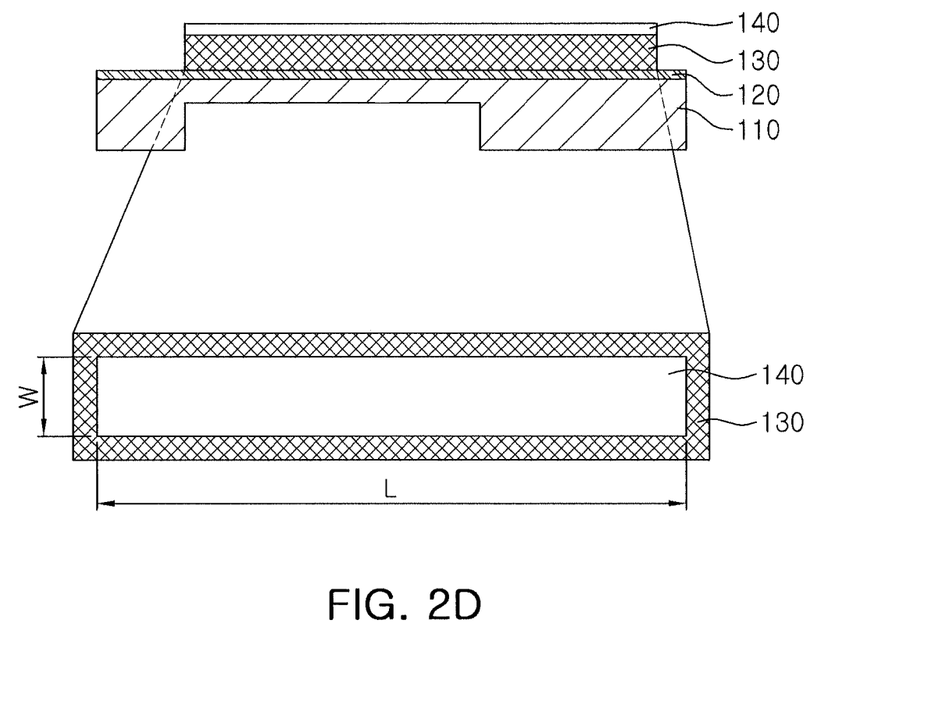

Although FIGS. 2A and 2D show a method of manufacturing a piezoelectric device for an inkjet print head by way of example, the present invention is not necessarily limited thereto but may be applied to a method of manufacturing various piezoelectric devices.

The method of manufacturing a piezoelectric device according to the embodiment of the present invention may include forming a first electrode (See FIG. 2B); forming a piezoelectric substance on the first electrode by printing a piezoelectric substance paste containing a piezoelectric substance composition thereon, the piezoelectric substance composition containing piezoelectric ceramic powder containing 90 parts by weight or more to less than 100 parts by weight of Pb (Zr, Ti) $O_3$, and more than 0 part by weight to 10 parts by weight or less of glass frit, based on 100 parts by weight of the piezoelectric substance composition, the glass frit containing 10 to 20 parts by weight of ZnO, based on 100 parts by weight of the glass frit (See FIG. 2C); forming a second electrode on the piezoelectric substance (See FIG. 2D); and sintering a substrate, the first electrode, the piezoelectric, substance, and the second electrode.

In addition, the method of manufacturing a piezoelectric device according to the embodiment of the present invention may be used particularly to manufacture an inkjet print head. In this case, the method of manufacturing a piezoelectric device according to the embodiment of the present invention may further include preparing a substrate made of single crystalline silicon and having an ink channel formed therein (See FIG. 2A).

Referring to FIG. 2A, an upper substrate 110 for an inkjet print head may be prepared. According to the embodiment of the present invention, the piezoelectric device may be formed on a pressure chamber of the inkjet print head. The present invention is not necessarily limited thereto but may be applied to various products for implementing micro-displacement movements.

The substrate for an inkjet print head may be prepared. More specifically, the upper substrate 110 having a pressure chamber formed therein and coupled to a piezoelectric device to thereby serve as a vibration plate may be prepared. As the upper substrate, a substrate made of single crystalline silicon may be used. However, the upper substrate is not limited thereto.

Referring to FIG. 2B, the first electrode 120 may be formed on the upper substrate 110. The first electrode 120 may be formed by depositing Ti/Pt on the substrate 110 through a sputtering method; however, the present invention is not necessarily limited thereto.

More specifically, the first electrode may be manufactured by forming a Pt sputtering layer on a Ti sputtering layer.

Referring to FIG. 2C, the piezoelectric substance 130 may be formed on the first electrode 120 by printing a piezoelectric substance paste 131 thereon through a screen printing method. The piezoelectric substance 130 may be formed by covering the first electrode 120 using a mask 400 and pressing the piezoelectric substance paste 131 using a squeezer 410. In this case, the piezoelectric substance 130 may be formed according to a shape of an opening part O formed in the mask 400.

The piezoelectric substance paste 131 may contain a piezoelectric substance composition containing piezoelectric ceramic powder containing 90 parts by weight or more to less than 100 parts by weight of Pb(Zr, Ti)$O_3$ and more than 0 part by weight to 10 parts by weight or less of glass frit, based on 100 parts by weight of the piezoelectric substance paste, the glass frit containing 10 to 20 parts by weight of ZnO, based on 100 parts by weight of the glass frit.

According to the embodiment of the present invention, since the piezoelectric substance paste contains the piezoelectric ceramic powder containing Pb(Zr, Ti)$O_3$, a piezoelectric device having excellent piezoelectric characteristics may be implemented. In addition, since the piezoelectric substance paste contains more than 0 part by weight to 10 parts by weight or less of glass frit, based on 100 parts by weight of the piezoelectric substance paste, a piezoelectric substance paste capable of being sintered at a low temperature may be provided.

In addition, since the glass frit contains ZnO, a piezoelectric substance paste capable of being sintered at a low temperature while implementing excellent dielectric characteristics and piezoelectric characteristics, without using an environmentally harmful material, such as Cd, may be provided.

Further, the glass frit may contain 10 to 20 parts by weight of ZnO, based on 100 parts by weight of the glass frit. When a content of ZnO is less than 10 parts by weight, a sintering temperature may exceed 900° C., while when a content of ZnO exceeds 20 parts by weight, dielectric characteristics and piezoelectric characteristics of the piezoelectric device may be deteriorated. Therefore, the glass frit may contain 10 to 20 parts by weight of ZnO.

According to the embodiment of the present invention, the piezoelectric ceramic powder have a composition of xPb (Mg$_{1/3}$Nb$_{2/3}$)-y(Ni$_{1/3}$Nb$_{2/3}$)-zZr-wTi—$O_3$, where each of x, y, z, and w is mol % and may satisfy $0.15 \leq x \leq 0.40$, $0.05 \leq y \leq 0.20$, $0.20 \leq z \leq 0.35$, and $0.30 \leq w \leq 0.45$.

Since the piezoelectric ceramic powder having the above-mentioned composition is used, a piezoelectric device having excellent piezoelectric characteristics may be provided and a micro-displacement movement having repeatability may be easily implemented.

According to the embodiment of the present invention, $Bi_2O_3$—$B_2O_3$—ZnO based glass frit may be used. The $Bi_2O_3$—$B_2O_3$—ZnO based glass frit may contain, but is not limited to, 65 to 85 parts by weight of $Bi_2O_3$ and 5 to 15 parts by weight of $B_2O_3$ based on 100 parts by weight of the glass frit in order to satisfy a sintering temperature range of the piezoelectric substance composition according to the embodiment of the present invention.

According to the embodiment of the present invention, since ZnO is mixed with $Bi_2O_3$ and $B_2O_3$ and then provided in the form of glass frit, a sintering temperature of a piezoelectric substance of a piezoelectric device may be easily lowered, and a piezoelectric substance having excellent crystallinity may be prepared.

Referring to FIG. 2D, the second electrode 140 may be printed on the piezoelectric substance 130. The second electrode 140 may be formed through a screen printing method but is not limited thereto. In the screen printing method, Ag—Pd based electrode paste may be used, and be sintered simultaneously with the piezoelectric substance.

According to the embodiment of the present invention, a piezoelectric device formed on the inkjet print head may be printed to have a length L of 5000 μm and a width W of 350 μm.

When electricity is applied to the first and second electrodes 120 and 140, a size and a shape of the piezoelectric substance 130 disposed between the first and second electrodes 120 and 140 may be deformed. Therefore, pressure is applied to a portion corresponding to the vibration plate 103, such that the ink may be discharged. A magnitude and a kind of applied voltage are controlled, whereby a magnitude of pressure may be controlled.

Figure 3:
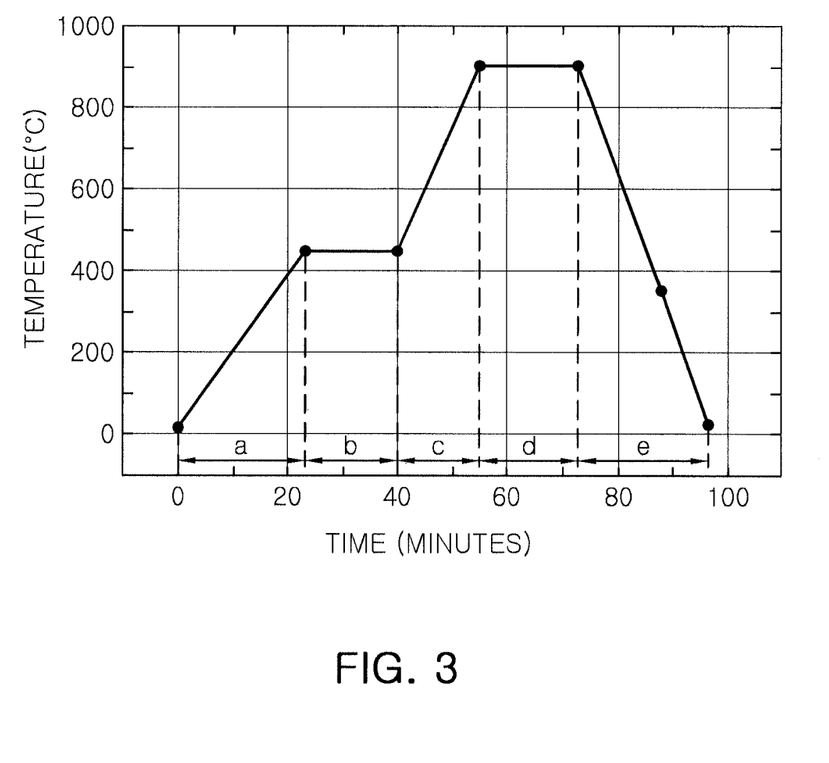
FIG. 3 is a graph showing a temperature change in a firing process of the inkjet print head according to an embodiment of the present invention.

FIG. 3 is a graph showing a processing temperature of the piezoelectric substance according to an embodiment of the present invention over time.

After the piezoelectric device including the first electrode 120, the piezoelectric substance 130, and the second electrode 140 is formed, a temperature may be gradually raised such that the piezoelectric device is introduced into a sintering process (period a).

The piezoelectric device may be soft baked at a temperature of about 120° C. The piezoelectric device may be pre-cured through the soft baking to thereby facilitate processing thereof.

The piezoelectric device may be primarily sintered at a temperature of about 400 to 450° C. (period b). An additive such as a binder contained in the piezoelectric device may be removed during the primary sintering process. Since the piezoelectric substance is prepared in a paste state, when the primary sintering is not performed, impurities may be formed in the piezoelectric substance. However, the piezoelectric device that does not include the impurities may be manufactured through the primary sintering.

A temperature is gradually raised, such that the piezoelectric device may be introduced into a secondary sintering process (period c). Then, secondary sintering may be performed at a temperature of 900 to 1000° C. (period d). The piezoelectric substance may be crystallized in the second sintering process.

According to the embodiment of the present invention, since the piezoelectric ceramic powder having a predetermined composition is used and the glass frit containing ZnO is used, the secondary sintering may be performed at a low temperature of 900 to 1000° C.

Since the secondary sintering is performed at a low temperature, a phenomenon in which the first electrode 120 reacts with the upper substrate 110 made of polycrystalline silicon and a phenomenon in which the second electrode 140 is volatized may be prevented. In addition, the piezoelectric device may be cooled after the secondary sintering (period e).

According to the embodiment of the present invention, since ZnO is mixed with the piezoelectric ceramic powder, in the form of glass frit, without using Cd, the sintering may be performed at a low temperature of 900 to 1000° C.

The piezoelectric characteristics of the piezoelectric substance may be confirmed through permittivity of the piezoelectric substance. Since the piezoelectric substance is formed between the first and second electrodes to thereby form capacitance, permittivity of the piezoelectric substance may be represented by the following equation.

$$C = \varepsilon \frac{A}{t}$$

Where C indicates capacitance of the piezoelectric device, ∈ indicates a dielectric constant representing permittivity of the piezoelectric substance, A indicates an opposite area of the electrodes, and t indicates a thickness of the piezoelectric substance.

In order to confirm electrical characteristic and sinterability of the piezoelectric device, a capacitance value of the piezoelectric device may be used. More specifically, the electrical characteristic and the sinterability of the piezoelectric device may be confirmed through the following equation.

∈A=Ct

It may be appreciated that when the opposite area A of the electrodes has the same value, the dielectric constant ∈ is in proportional to the product of the capacitance C and the thickness t of the piezoelectric substance. As a magnitude of the product of the capacitance C and the thickness t of the piezoelectric substance increases, a piezoelectric substance having a large dielectric constant ∈ may be implemented. That is, a piezoelectric substance having excellent permittivity and sinterability may be prepared.

Example 1

The same piezoelectric ceramic glass powders were mixed with glass frit according to Example of the present invention and Comparative Examples, to thereby prepare a piezoelectric substance composition.

PZT powder having perovskite structure and a composition of Pb(Zr, Ti)O$_3$ was used as piezoelectric ceramic glass powder and mixed with glass frit in the amount of 1:99 wt % to thereby prepare the piezoelectric substance compositions.

Glass frit having a composition of 75 wt % of Bi$_2$O$_3$, 10 wt % of B$_2$O$_3$, and 15 wt % of ZnO was used as glass frit according to Example 1 of the present invention, and glass frit having a composition of 60 wt % of Bi$_2$O$_3$, 10 wt % of B$_2$O$_3$, and 30 wt % of CdO was used as glass frit according to Comparative Example 1. In addition, glass frit having a composition of 65 wt % of Bi$_2$O$_3$, 10 wt % of B$_2$O$_3$, 12.5 wt % of SiO$_2$, and 12.5 wt % of Al$_2$O$_3$ was used as glass frit according to Comparative Example 2.

TABLE 1

|  | t (μm) | C (pF) | t × C |
|---|---|---|---|
| Example 1 | 23.7 | 860 | 20382 |
| Comparative Example 1 | 24.5 | 750 | 18375 |
| Comparative Example 2 | 25.2 | 590 | 14868 |

As described above, as a piezoelectric device has excellent sinterability and piezoelectric characteristics, a value corresponding to the multiplication of a capacitance and a piezoelectric substance thickness increases. Table 1 shows thicknesses t of piezoelectric substances, capacitances C, t×C values according to Example 1 and Comparative Examples 1 and 2.

It might be appreciated that Example 1 has a largest t×C value, Comparative Example 1 has a t×C value smaller than that of Example 1 by 10%, and Comparative Example 2 has a t×C value smaller than that of Example 1 by 27%.

That is, it might be appreciated that a piezoelectric substance more excellent dielectric characteristics and sinterability may be prepared in a case in which the glass frit containing ZnO according to the Example of the present invention is used, rather than in a case in which the glass frit containing Cd (Comparative Example 1) or Si and Al (Comparative Example 2) is used.

Figure 4A:
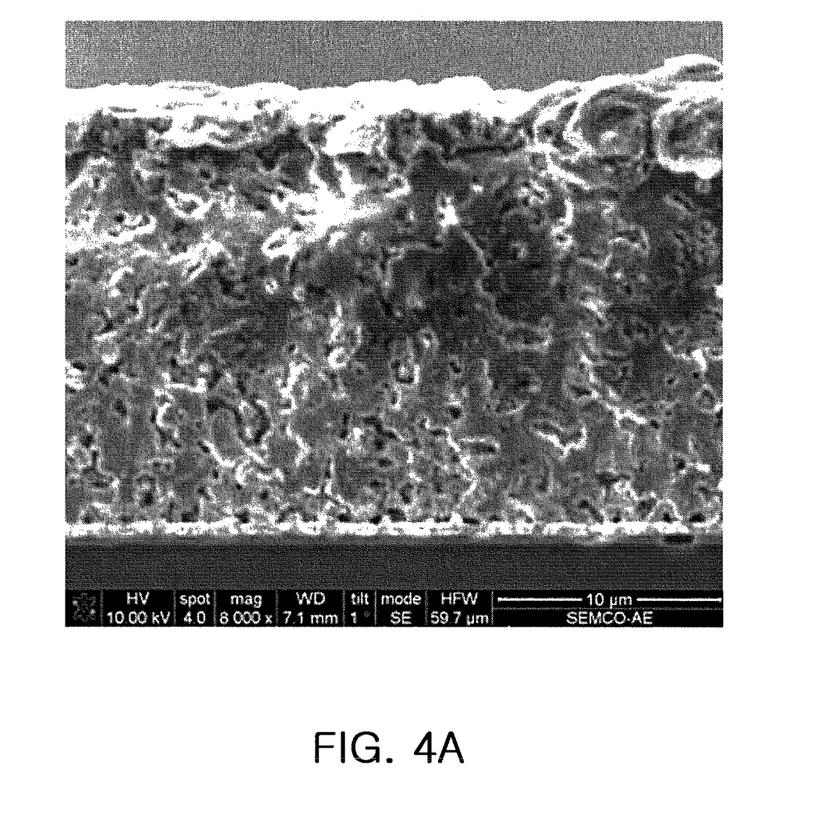
FIGS. 4A through 4C are scanning electron microscope (SEM) images showing cross sections of piezoelectric devices according to an Example of the present invention and Comparative Examples.

FIG. 4A is a scanning electron microscope (SEM) image showing a cross section of a piezoelectric substance according to Example 1 of the present invention. In addition, FIGS. 4B and 4C are SEM images showing cross sections of piezoelectric substances according to Comparative Examples 1 and 2.

Figure 4B:
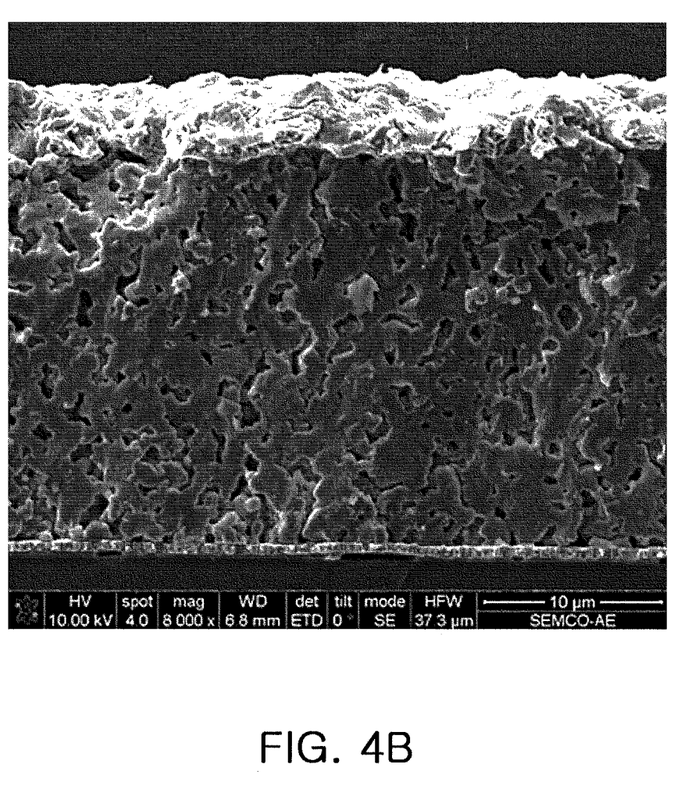
Figure 4C:
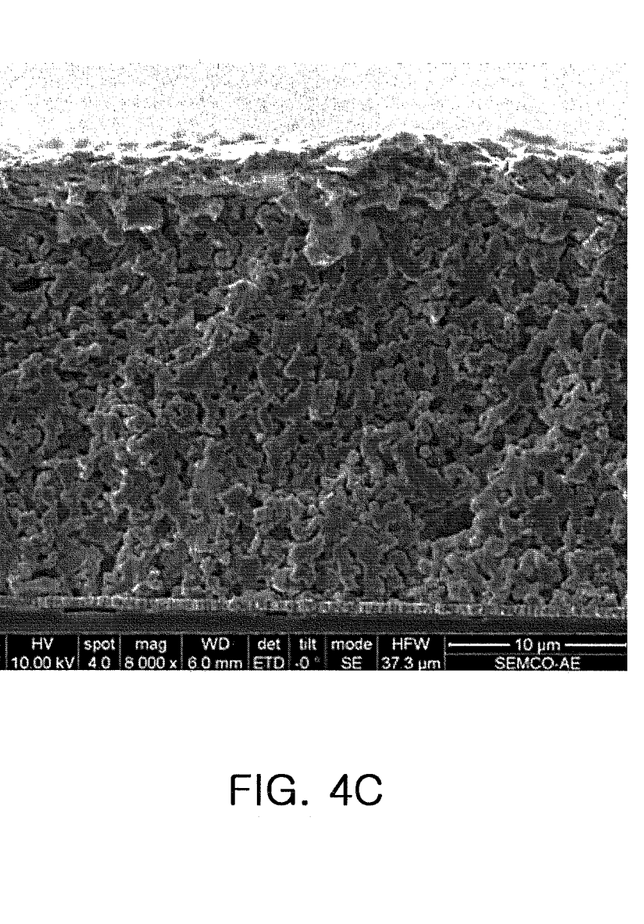

It might be appreciated that a gap between particles is enlarged and sinterability is deteriorated in the cases of FIGS. 4B (Comparative Example 1) and 4C (Comparative 2), as compared to a case of FIG. 4A (Example 1).

According to the embodiment of the present invention, a sintering temperature may be lowered using the glass frit containing ZnO without containing Cd. Furthermore, a piezoelectric substance having excellent sinterability and piezoelectric characteristics may be prepared.

Example 2

According to Example 2 of the present invention, PZT powder having a perovskite structure and a composition of Pb (Zr, Ti)O$_3$ was used as piezoelectric ceramic glass powder and mixed with glass frit in the amount of 1:99 to thereby prepare the piezoelectric substance composition. In addition, glass frit having a composition of 75 wt % of Bi$_2$O$_3$, 10 wt % of B$_2$O$_3$, and 15 wt % of ZnO was used.

Further, 5 wt % of terpineol and 7 wt % of butyl carbitol acetate were used as a solvent, 1 wt % of BYK-111, which is a dispersing agent available from BYK Co., was used a dispersing agent, and 5 wt % of ethylcellulose was used as a binder, in addition to 82 wt % of the piezoelectric substance composition, to thereby prepare a piezoelectric substance paste.

The piezoelectric substance paste was prepared to have a predetermined viscosity, for example, 250,000 cps, through a milling process and was applied in a screen printing method.

A deformation amount was measured while being scanned by applying voltage from an upper portion of the vibration plate to the piezoelectric device, for example, by applying voltage to the piezoelectric device using a laser Doppler velocity meter (LDV) in a state in which the piezoelectric device is applied to the inkjet print head, without ink. The average displacement was measured by applying a voltage of 70V at a frequency of a 2 kHz.

The average displacement of the piezoelectric device at a corresponding point was calculated by averaging the deformation amount of the piezoelectric device from scanned data. In addition, the average displacement was measured for each point according to a position of the piezoelectric device. The average displacement of the piezoelectric device according to the position thereof was represented by a graph of FIG. 5.

Figure 5:
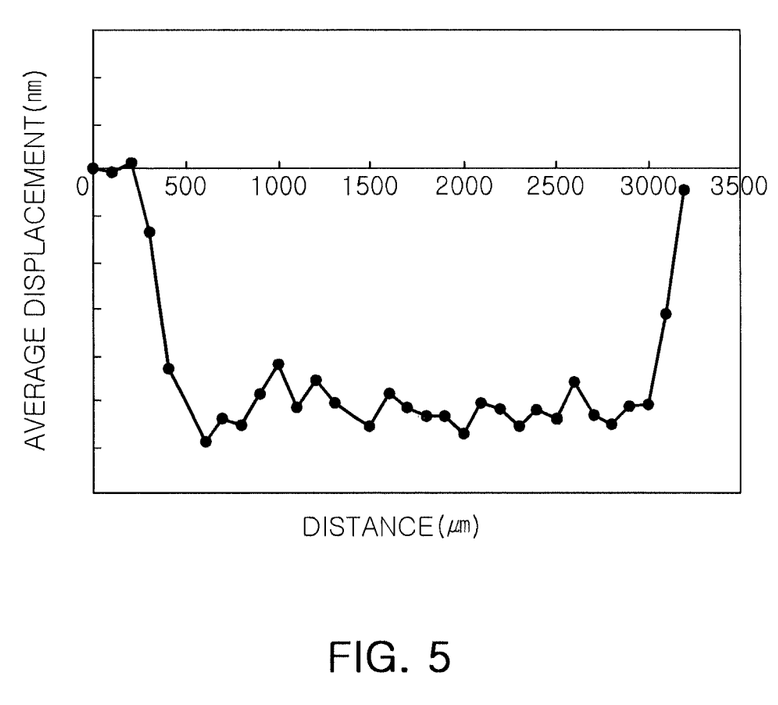
FIG. 5 is a graph showing the average displacement according to a position of the inkjet print head according to an embodiment of the present invention.

Referring to FIG. 5, it might be appreciated that the average displacement of the piezoelectric device according to the position thereof has constant values in almost all areas. That is, according to the embodiment of the present invention, it might be appreciated that a micro-movement having uniformity, repeatability and high reliability may be implemented by the piezoelectric device.

In addition, in the same piezoelectric substance paste composition, only glass frit was replaced to prepare piezoelectric substance compositions according to Comparative Examples 3 and 4. Glass frit having a composition of 60 wt % of Bi$_2$O$_3$, 10 wt % of B$_2$O$_3$, and 30 wt % of CdO was used as glass frit according to Comparative Example 3. In addition, glass frit having a composition of 65 wt % of Bi$_2$O$_3$, 10 wt % of B$_2$O$_3$, 12.5 wt % of SiO$_2$, and 12.5 wt % of Al$_2$O$_3$ was used as glass frit according to Comparative Example 4.

Thicknesses t of piezoelectric substances, average displacements, t×average displacement values according to Example 2 and Comparative Examples 3 and 4 were shown in the following Table 2.

TABLE 2

| | t (μm) | Average Displacement (nm) | t × Average Displacement |
|---|---|---|---|
| Example 2 | 23.7 | 179 | 4242.3 |
| Comparative Example 3 | 24.5 | 165 | 4042.5 |
| Comparative Example 4 | 25.2 | 88 | 2217.6 |

It might be appreciated that Example 2 of the present invention has a largest average displacement magnitude of 179 nm. In addition, it might be appreciated that Comparative Example 3 has a value smaller than that of Example 2 by 4% and Comparative Example 4 has a value smaller than that of Example 2 by 48% or more.

That is, the present invention might also implement micro-movements larger than those of the Comparative Examples. That is, it might be appreciated that micro-movements may be more accurately controlled.

When the piezoelectric device according to the embodiment of the present invention is implemented in the inkjet print head, an amount of discharged ink may be more accurately controlled.

As set forth above, according to the embodiment of the present invention, the piezoelectric substance capable of being sintered at a low temperature without using Cd may be provided. Therefore, many defects due to high temperature sintering may be solved without using Cd, a target of environmental regulations. That is, a piezoelectric device that neither uses nor generates a material harmful to the environment to thereby secure stability may be provided.

According to another embodiment of the present invention, the piezoelectric device having excellent piezoelectric characteristics may be provided. Since the piezoelectric device having excellent permittivity may be manufactured, repeatability of micro-displacement movements may be secured according to applied voltage. Therefore, the piezoelectric device capable of being used in various electronic components for implementing the micro-displacement movement may be manufactured.

While the present invention has been shown and described in connection with the embodiments, it will be apparent to those skilled in the art that modifications and variations can be made without departing from the spirit and scope of the invention as defined by the appended claims.

What is claimed is:

1. A piezoelectric device comprising piezoelectric ceramic powder containing 90 parts by weight or more to less than 100 parts by weight of xPb(Mg$_{1/3}$Nb$_{2/3}$)-y(Ni$_{1/3}$Nb$_{2/3}$)-zZr-wTi—O3, where each of x, y, z, and w is mol % and satisfies 0.15≤x≤0.40, 0.05≤y≤0.20, 0.20≤z≤0.35 and 0.30≤w≤0.45, and more than 0 part by weight to 10 parts by weight or less of glass frit, based on 100 parts by weight of a piezoelectric substance composition for the piezoelectric device,
wherein the glass frit contains 10 to 20 parts by weight of ZnO, based on 100 parts by weight of glass frit.

2. The piezoelectric device of claim 1, wherein the glass frit contains 65 to 85 parts by weight of Bi$_2$O$_3$ and 5 to 15 parts by weight of B$_2$O$_3$ based on 100 parts by weight of glass frit.

3. The piezoelectric device of claim 1, wherein the piezoelectric device is formed by printing a piezoelectric substance paste for preparing a piezoelectric substance, the piezoelectric substance paste containing 80 to 85 parts by weight of the piezoelectric substance composition, 10 to 14 parts by weight of a solvent, and 1 to 10 parts by weight of an additive, based on 100 parts by weight of the piezoelectric substance paste.

4. The piezoelectric device of claim 3, wherein a sintering temperature of the piezoelectric substance paste is 900 to 1000° C.

5. A piezoelectric type inkjet print head comprising:
a substrate including a pressure chamber formed therein;
a first electrode formed on the pressure chamber of the substrate;
a piezoelectric substance containing the piezoelectric substance composition for the piezoelectric device of claim 1; and
a second electrode formed on the piezoelectric substance.

6. A method of manufacturing a piezoelectric device, the method comprising:
forming a first electrode;
forming a piezoelectric substance on the first electrode by printing a piezoelectric substance paste containing a piezoelectric substance composition thereon, the piezoelectric substance composition containing piezoelectric ceramic powder containing 90 parts by weight or more to less than 100 parts by weight of $xPb(Mg_{1/3}Nb_{2/3})$-$y(Ni_{1/3}Nb_{2/3})$-$zZr$-$wTi$—$O_3$, where each of x, y, z, and w is mol % and satisfies $0.15 \leq x \leq 0.40$, $0.05 \leq y \leq 0.20$, $0.20 \leq z \leq 0.35$, and $0.30 \leq w \leq 0.45$, and more than 0 part by weight to 10 parts by weight or less of glass frit, based on 100 parts by weight of the piezoelectric substance composition, the glass frit containing 10 to 20 parts by weight of ZnO, based on 100 parts by weight of glass frit;

forming a second electrode on the piezoelectric substance; and sintering a substrate, the first electrode, the piezoelectric substance, and the second electrode.

7. The method of claim 6, wherein the piezoelectric substance paste contains 80 to 85 parts by weight of the piezoelectric substance composition, 10 to 14 parts by weight of a solvent, and 1 to 10 parts by weight of an additive, based on 100 parts by weight of the piezoelectric substance paste.

8. The method of claim 6, wherein a sintering temperature of the piezoelectric substance paste is 900 to 1000° C.

9. The method of claim 6, wherein the glass frit contains 65 to 85 parts by weight of $Bi_2O_3$ and 5 to 15 parts by weight of $B_2O_3$ based on 100 parts by weight of glass frit.

10. A method of manufacturing an inkjet print head, the method comprising:

preparing a substrate made of single crystalline silicon and having an ink channel formed therein; and forming the piezoelectric device of claim 6 on the substrate.

11. A piezoelectric type inkjet print head comprising:
a substrate including a pressure chamber formed therein;
a first electrode formed on the pressure chamber of the substrate;
a piezoelectric substance containing the piezoelectric substance composition for the piezoelectric device of claim 2; and
a second electrode formed on the piezoelectric substance.

12. A piezoelectric type inkjet print head comprising:
a substrate including a pressure chamber formed therein;
a first electrode formed on the pressure chamber of the substrate;
a piezoelectric substance containing the piezoelectric substance composition for the piezoelectric device of claim 3; and
a second electrode formed on the piezoelectric substance.

13. A piezoelectric type inkjet print head comprising:
a substrate including a pressure chamber formed therein;
a first electrode formed on the pressure chamber of the substrate;
a piezoelectric substance containing the piezoelectric substance composition for the piezoelectric device of claim 4; and
a second electrode formed on the piezoelectric substance.

* * * * *